(12) United States Patent
Freed et al.

(10) Patent No.: US 11,217,448 B2
(45) Date of Patent: Jan. 4, 2022

(54) METHODS FOR REDUCING TRANSFER PATTERN DEFECTS IN A SEMICONDUCTOR DEVICE

(71) Applicant: APPLIED Materials, Inc., Santa Clara, CA (US)

(72) Inventors: Regina Freed, Santa Clara, CA (US); Steven R. Sherman, Newton, MA (US); Nadine Alexis, Santa Clara, CA (US); Lin Zhou, San José, CA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 16/944,051

(22) Filed: Jul. 30, 2020

(65) Prior Publication Data

US 2020/0357639 A1    Nov. 12, 2020

Related U.S. Application Data

(63) Continuation of application No. 16/448,374, filed on Jun. 21, 2019, now Pat. No. 10,777,414.

(60) Provisional application No. 62/818,389, filed on Mar. 14, 2019.

(51) Int. Cl.
*H01L 21/033*    (2006.01)
*H01L 21/311*    (2006.01)

(52) U.S. Cl.
CPC .... *H01L 21/0337* (2013.01); *H01L 21/31122* (2013.01)

(58) Field of Classification Search
None
See application file for complete search history.

(56) References Cited

U.S. PATENT DOCUMENTS

| 6,156,461 | A | 12/2000 | Grenon et al. |
| 9,984,889 | B2 | 5/2018 | Ruffell et al. |
| 10,777,414 | B1* | 9/2020 | Freed ................ H01L 21/31122 |
| 2009/0127722 | A1 | 5/2009 | Noelscher et al. |

(Continued)

FOREIGN PATENT DOCUMENTS

KR    10-2002-0018483 A    3/2002

OTHER PUBLICATIONS

International Search Report dated Jun. 18, 2020 for the International Patent Application No. PCT/US2020/019627, filed on Feb. 25, 2020, 3 pages.

(Continued)

*Primary Examiner* — Roberts P Culbert
(74) *Attorney, Agent, or Firm* — Kacvinsky Daisak Bluni PLLC

(57) ABSTRACT

Disclosed are methods for reducing transfer pattern defects in a semiconductor device. In some embodiments, a method includes providing a semiconductor device including a plurality of photoresist lines on a stack of layers, wherein the plurality of photoresist lines includes a bridge defect extending between two or more photoresist lines of the plurality of photoresist lines. The method may further include forming a plurality of mask lines by etching a set of trenches in a first layer of the stack of layers, and removing the bridge defect by etching the bridge defect at a non-zero angle of inclination with respect to a perpendicular to a plane of an upper surface of the stack of layers.

20 Claims, 8 Drawing Sheets

(56) References Cited

U.S. PATENT DOCUMENTS

2016/0293405 A1 10/2016 Matsumoto et al.
2020/0098589 A1 3/2020 Ma et al.

OTHER PUBLICATIONS

Written Opinion dated Jun. 18, 2020 for the International Patent Application No. PCT/US2020/019627, filed on Feb. 25, 2020, 4 pages.

* cited by examiner

METHODS FOR REDUCING TRANSFER PATTERN DEFECTS IN A SEMICONDUCTOR DEVICE

CROSS-REFERENCE TO RELATED APPLICATION

This application claims priority to and is a continuation application of U.S. Non-Provisional patent application Ser. No. 16/448,374, filed on Jun. 21, 2019, entitled "METHODS FOR REDUCING TRANSFER PATTERN DEFECTS IN A SEMICONDUCTOR DEVICE," which claims priority to U.S. Provisional Patent Application No. 62/818,389, filed Mar. 14, 2019, entitled "Methods for Reducing Transfer Pattern Defects in a Semiconductor Device," and are incorporated by reference herein in their entirety.

FIELD

The present embodiments relate to processing methods, and more particularly, to selective device etching for bridge and line defect correction.

BACKGROUND

In the integrated circuit (IC) industry today, billions of semiconductor devices are built on a single substrate, generally referred to as a wafer. The current demands for high density and performance associated with ultra large-scale integration entail the use of submicron features, increased transistor and circuit speeds, and improved reliability.

Defects, such as line and bridge defects, also known as nano-bridging, are one of the larger sources of wafer defects during the lithography step for advanced nodes. Bridge defects are especially prevalent in extreme ultraviolet (EUV) lithography, where dose limitation and high photon absorption rate make the process particularly prone to bridge defects at the bottom of the features due to an underdeveloped photoresist. Previous post-processing methods to remove bridge defects are undesirable because the methods also consume the photoresist. Consuming the photoresist indiscriminately results in a loss in resist height, making it difficult to transfer etch patterns.

Therefore, there is an ongoing need to more effectively correct bridge and line defects in semiconductor devices.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In some embodiments, a method may include providing a semiconductor device including a stack of layers, wherein the stack of layer includes a bridge defect, and wherein the stack of layers includes a substrate, a masking layer atop the substrate, and a patterned photoresist atop the masking layer. The method may further include forming a plurality of device features by etching a set of trenches in the stack of layers, and removing the bridge defect between two or more device features of the plurality of device features by etching the bridge defect at a non-zero angle of inclination with respect to a perpendicular to a plane of an upper surface of the masking layer.

In some embodiments, a method for minimizing device defects may include providing a semiconductor device including a plurality of photoresist lines on a stack of layers, wherein the plurality of photoresist lines includes a line defect, and wherein a bridge defect extends between two or more photoresist lines of the plurality of photoresist lines. The method may further include etching the semiconductor device to form a plurality of masking lines in a masking layer of the stack of layers, wherein the line defect is not present in the plurality of masking lines, and removing the bridge defect by etching the bridge defect at a non-zero angle of inclination with respect to a perpendicular to a plane of an upper surface of a substrate of the stack of layers.

In some embodiments, a method for reducing transfer pattern defects in a semiconductor device may include providing a semiconductor device including a plurality of photoresist lines on a stack of layers, wherein the plurality of photoresist lines includes a line defect, and wherein a bridge defect extends between two or more photoresist lines of the plurality of photoresist lines. The method may further include etching the semiconductor device to form a set of trenches in a masking layer of the stack of layers, wherein the line defect is not transferred to the masking layer during formation of the set of trenches. The method may further include removing the bridge defect by etching the bridge defect at a non-zero angle of inclination with respect to a perpendicular to a plane of an upper surface of a substrate of the stack of layers.

Figure 1:
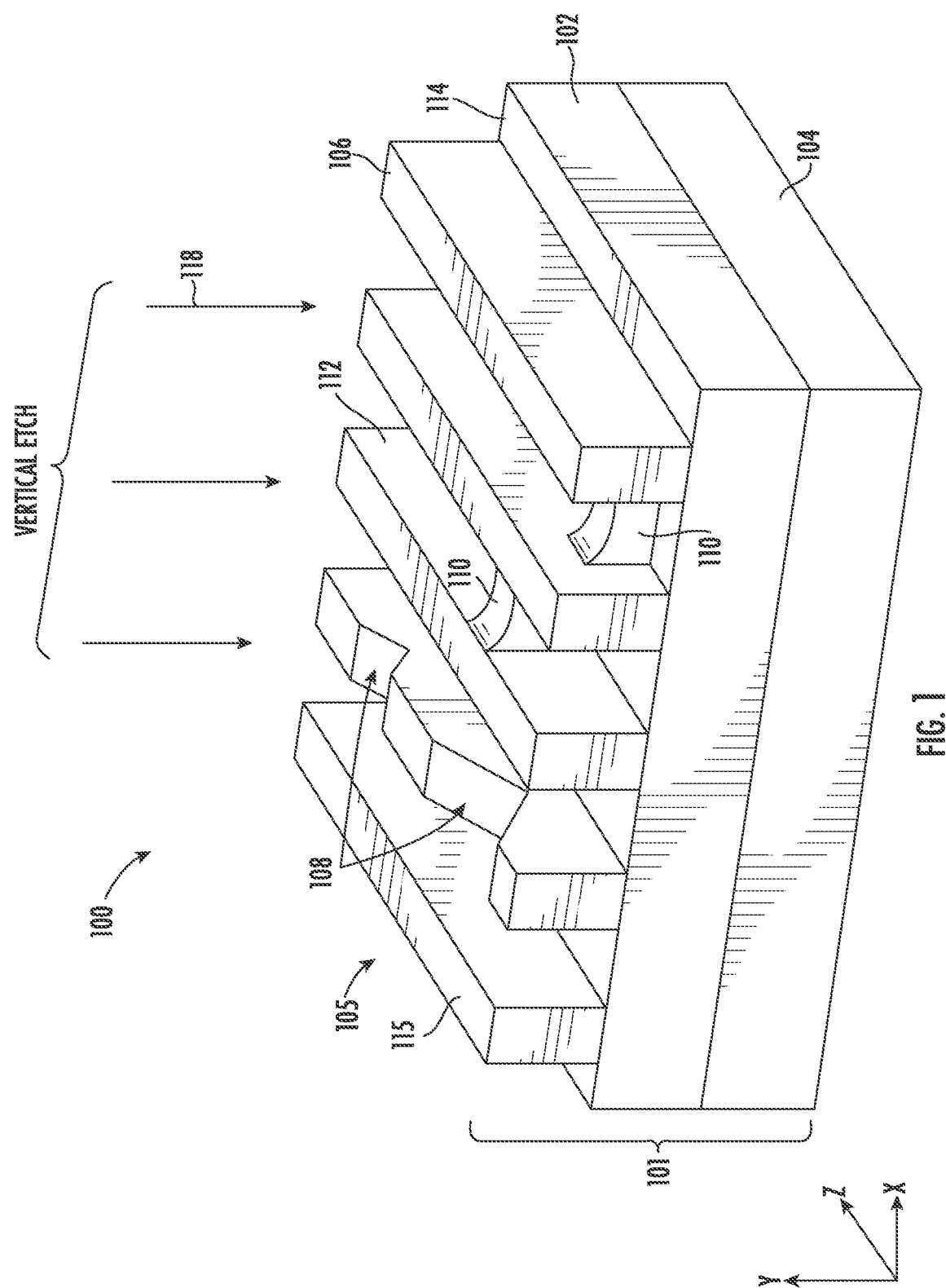
FIG. 1 depicts a perspective view of a semiconductor device including a stack of layers in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The methods may be embodied in many different forms and are not to be construed as being limited to the embodiments set forth herein. Instead, these embodiments are provided so this disclosure will be thorough and complete, and will fully convey the scope of the system and method to those skilled in the art.

Current art approaches do not effectively address line and bridge defects during lithography and etch processes, as there are tradeoffs between mitigating broken line defects versus bridging defects. For example, the EUV dose may be significantly increased in an attempt to prevent bridge defects, resulting in increased line defects and decreased wafer throughput.

Embodiments according to the present disclosure address the deficiencies of the current art by providing a multi-etch process, whereby bridging defects and broken line defects can be separately removed. For example, a first etch process addresses broken line defects, and a second etch process addresses bridge defects. Embodiments herein may be particularly effective for small features sizes (e.g., less than 30 nm pitch).

Turning now to FIG. 1, there is shown a cross-sectional view of a semiconductor device (hereinafter "device") 100 according to various embodiments of the disclosure. As shown, the device 100 includes a stack of layers 101 including a first layer 102 atop a second layer 104. Although non-limiting, the first layer 102 may be a masking layer, while the second layer 104 may be a substrate. The stack of layers 101 may further include a patterned photoresist 105, which is provided over the first layer 102.

As shown, the patterned photoresist 105 may include a plurality of device features, such as photoresist lines 106, formed over the first layer 102. In various embodiments, the plurality of photoresist lines 106 may form part of a larger pattern of features disposed on a silicon wafer or other substrate. Accordingly, the plurality of photoresist lines 106 may be characteristic of many other similar features disposed on the first layer 102, such as millions of other similar features. In some non-limiting embodiments, the plurality of photoresist lines 106 may be part of a metal oxide EUV resist. In some embodiments, each of the plurality of photoresist lines 106 may have a uniform height and width across the device 100. In other embodiments, the plurality of device features may include one or more cut masks, such as a series of short line segments or elongated ovals.

As shown, the stack of layers 101 may include at least one device defect, such as a line defect 108 in the form of an indentation, void, or break in the plurality of photoresist lines 106. Furthermore, the plurality of photoresist lines 106 may include one or more bridge defects 110 extending between two or more photoresist lines of the plurality of photoresist lines 106. As shown, the bridge defects 110 may include portions of the patterned photoresist 105 unintentionally left remaining after patterning. In some examples, the bridge defects 110 extend only partially up sidewall surfaces 112 of the plurality of photoresist lines 106 from a top surface 114 of the first layer 102. In other embodiments, the bridge defects 110 extend to a top surface 115 of the patterned photoresist 105. As shown, the bridge defects 110 may be oriented perpendicular to a primary length axis (e.g., z-axis) of each of the plurality of photoresist lines 106. Although shown in the patterned photoresist 105, it will be appreciated that the line defect 108 and the bridge defect 110 may be present in any layer of the stack of layers 101.

In some embodiments, the first layer 102 may include multiple layers. For example, the first layer 102 may be a stack of layers including, but not limited to, an under layer, a carbon layer, a first dielectric layer, a metal dielectric, and a second dielectric layer. The approaches herein can be used to remove one or more defects present within a layer of the stack of layer making up the first layer 102. In one example, when an adhesion layer and multiple hard mask material layers are present beneath the patterned photoresist 105, it's possible to selectively push any of the multiple hard mask material layers. In other embodiments, defects may be removed from a memorization layer, for example, an oxide layer of the second layer 104.

Figure 2:
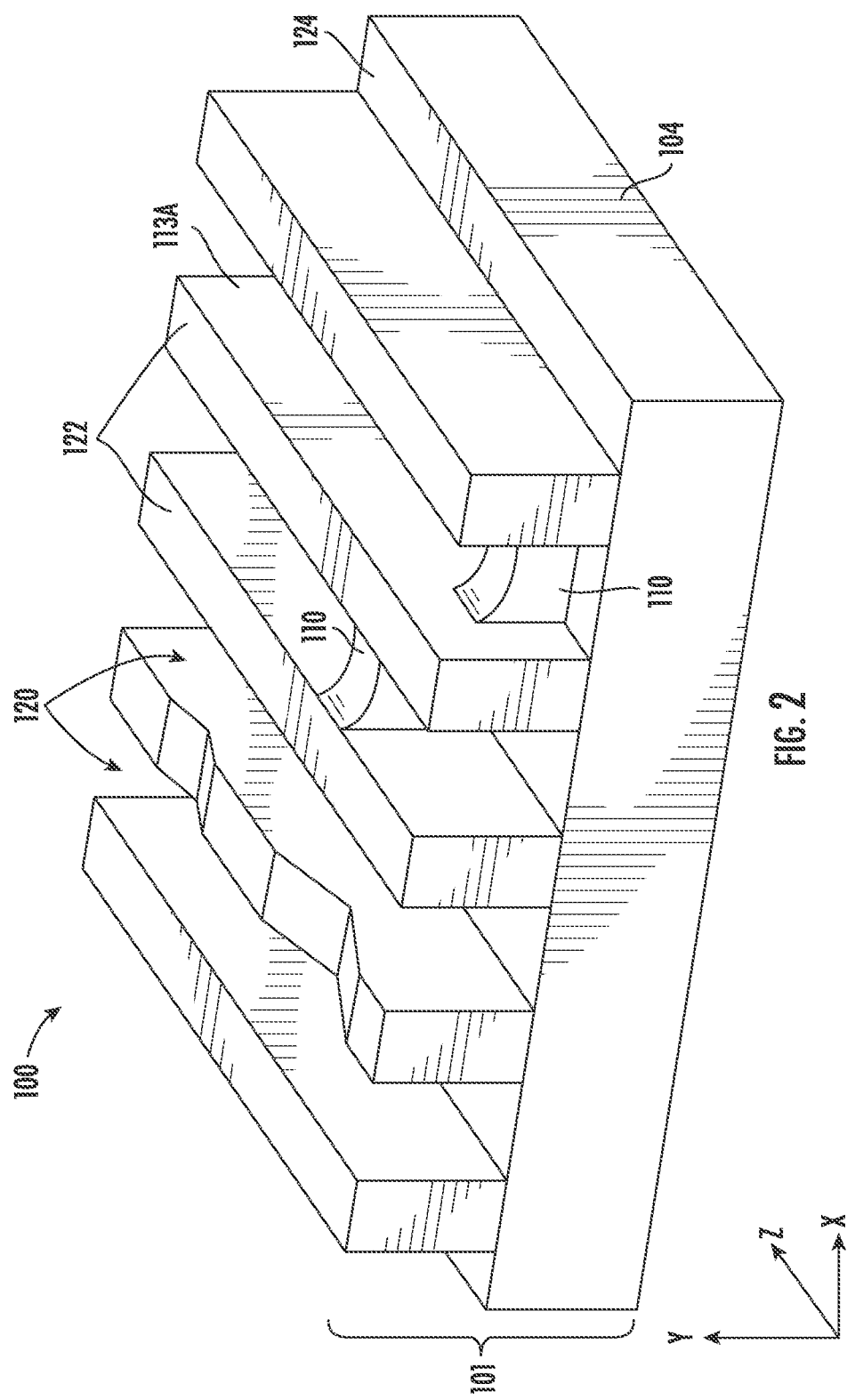
FIG. 2 is a perspective view of the semiconductor device of FIG. 1 including a plurality of trenches formed therein in accordance with embodiments of the present disclosure.
Figure 3:
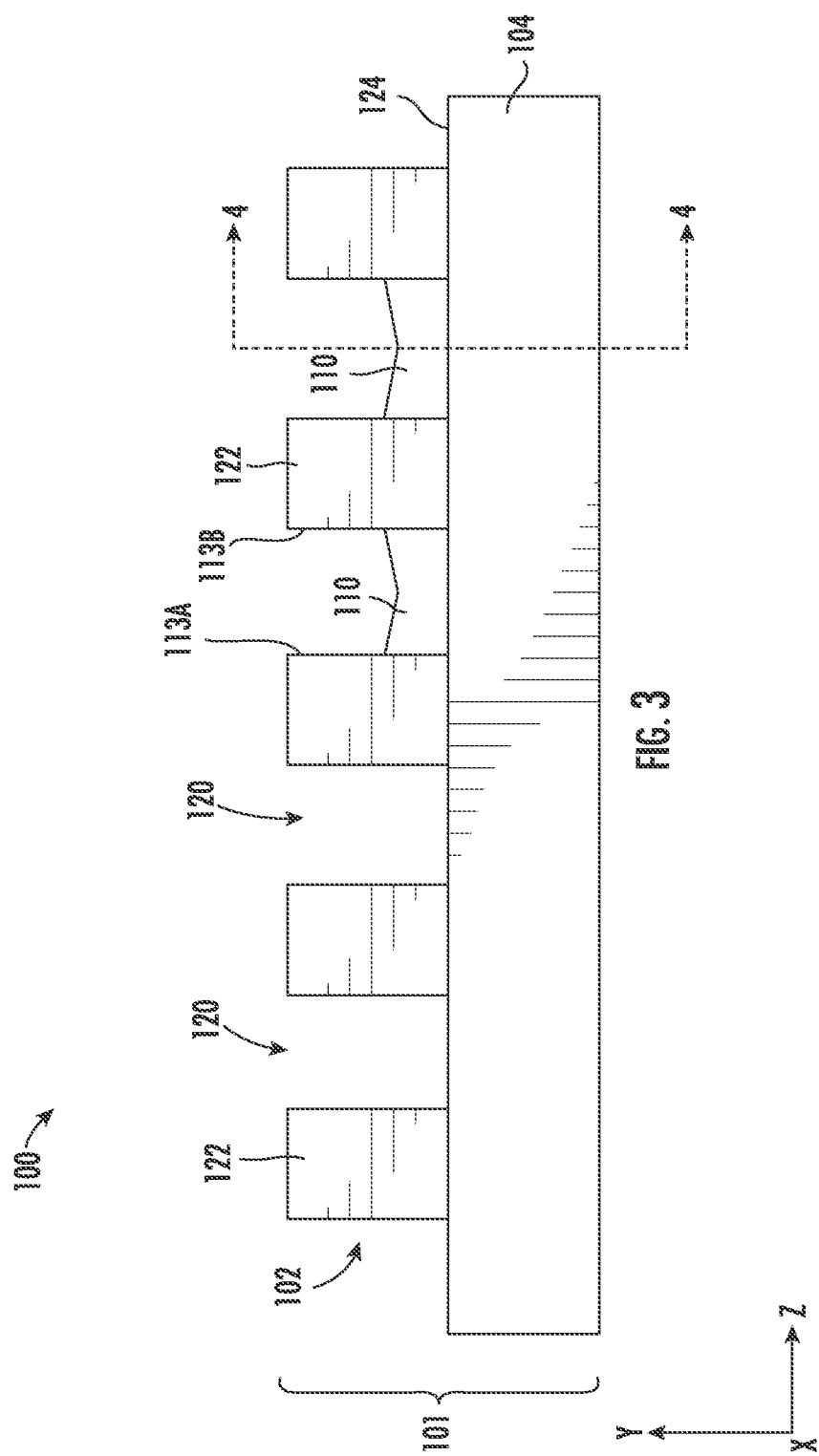
FIG. 3 is a side view of the semiconductor device of FIG. 2 in accordance with embodiments of the present disclosure.

As further shown in FIG. 1, a first etch process 118 may then be performed to the device 100. In some examples, the first etch process 118 may be a vertical/anisotropic reactive ion etch (RIE), which results in the structure of the device 100 demonstrated in FIGS. 2-3. As shown, a set of trenches 120 may be formed in the stack of layers 101 by etching the first layer 102. The first etch process 118 may be selective to an upper surface 124 of the second layer 104, for example, in those areas of the trenches 120 without bridge defects 110.

Once patterned, the first layer 102 may include a plurality of mask lines 122, wherein the line defects 108 (FIG. 1) are not transferred to the plurality of mask lines 122. The bridge defects 110 may be transferred to the first layer 102, however. As demonstrated in FIG. 3, the bridge defects 110 may extend between a first mask line sidewall 113A and a second mask line sidewall 113B of the plurality of mask lines 122.

Figure 4:
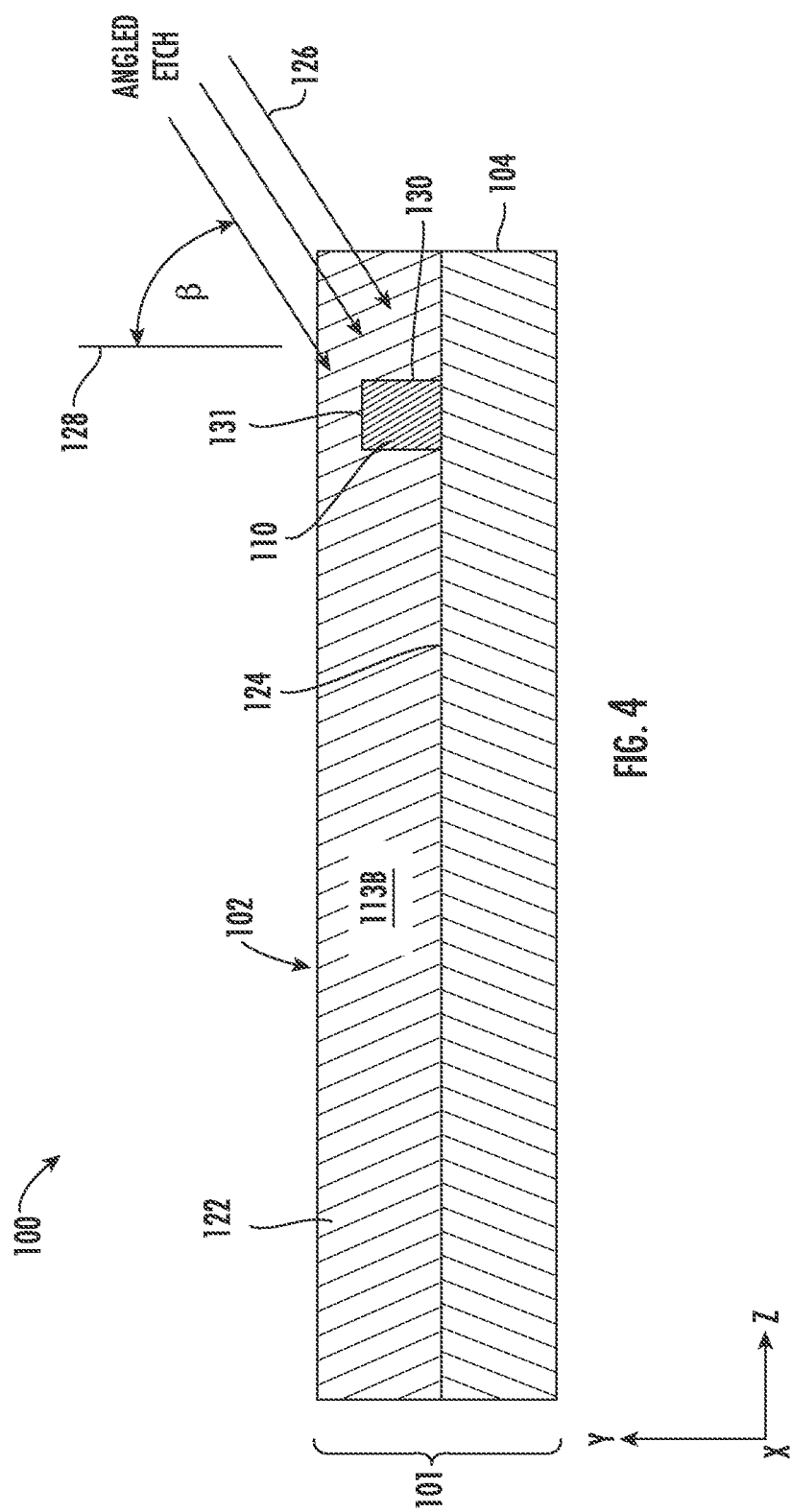
FIG. 4 is a cross-sectional view along cut line 4-4 of FIG. 3 in accordance with embodiments of the present disclosure.
Figure 5:
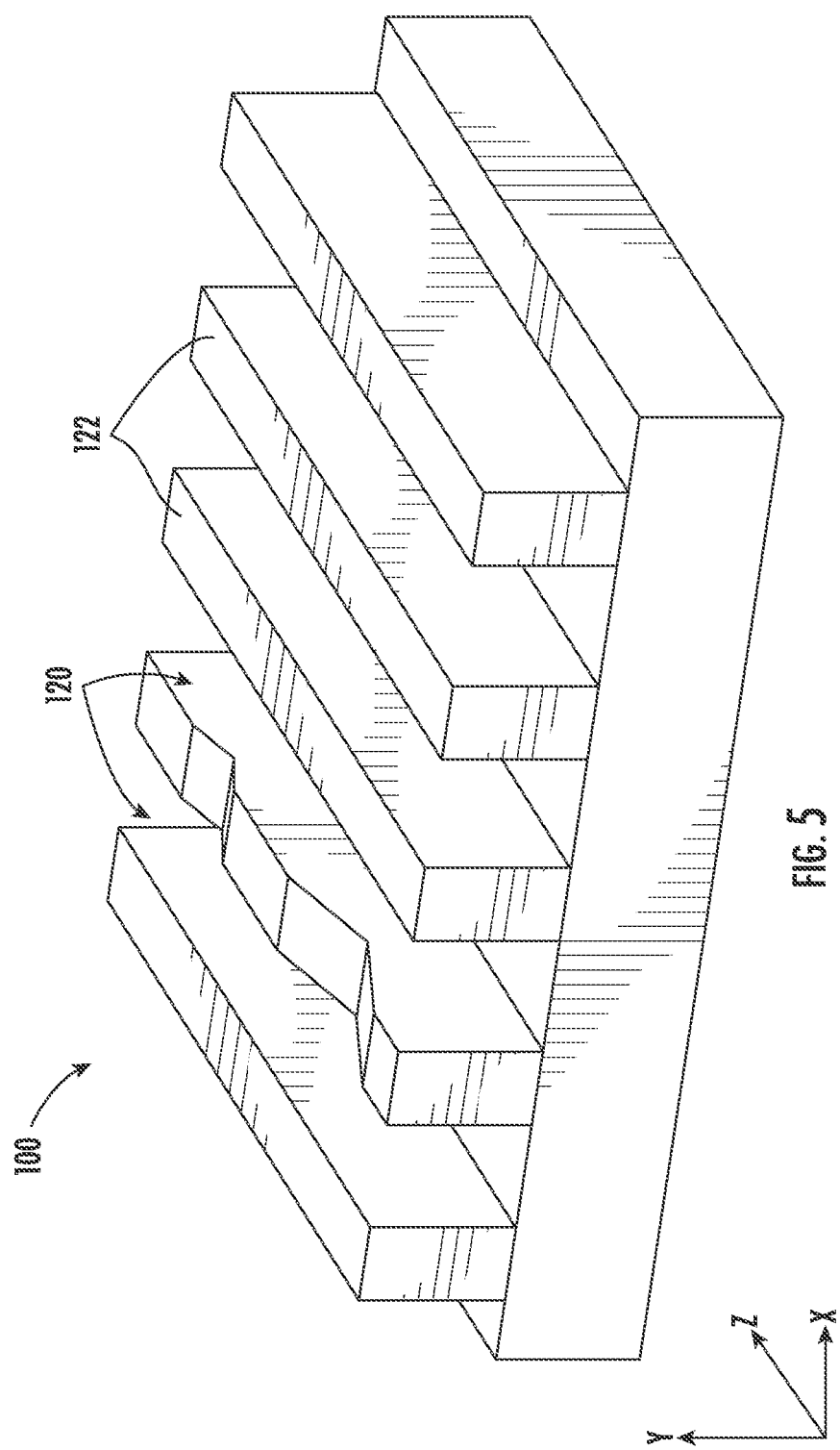
FIG. 5 is a perspective view of the semiconductor device of FIG. 4 following a directional etch in accordance with embodiments of the present disclosure.

In FIG. 4, the bridge defects 110 may be removed by performing a second etch process 126 delivered at a non-zero angle of inclination ((3) with respect to a perpendicular 128 to a plane defined by the upper surface of 124 of the second layer 104. Although non-limiting, the non-zero angle of inclination may be approximately 60°. To remove the bridge defects 110, the second etch process 126 is operable to impact a sidewall 130 and a top surface 131 thereof. As shown, the second etch process 126 may be delivered substantially parallel to a plane defined by the sidewall surface 113A of the plurality of mask lines 122. In various embodiments, the second etch process 126 is an anisotropic reactive ion etch or an isotropic reactive ion etch. Following the second etch process 126, the bridge defects 110 may be removed selective to the upper surface of 124 of the second layer 104, resulting in the structure shown in FIG. 5.

The multi-etch process demonstrated in FIGS. 1-5 overcomes the deficiencies of the current art by providing a multi-etch process, whereby bridging defects and broken line defects can be separately removed. For example, any line defects present in the plurality of photoresist lines 106 are not transferred to the mask lines during the first etch process 118 (FIG. 1). Furthermore, as a result of the second etch process 126 (FIG. 4), the bridge defects 110 present within the trenches 120 may be eliminated or substantially reduced.

Figure 6:
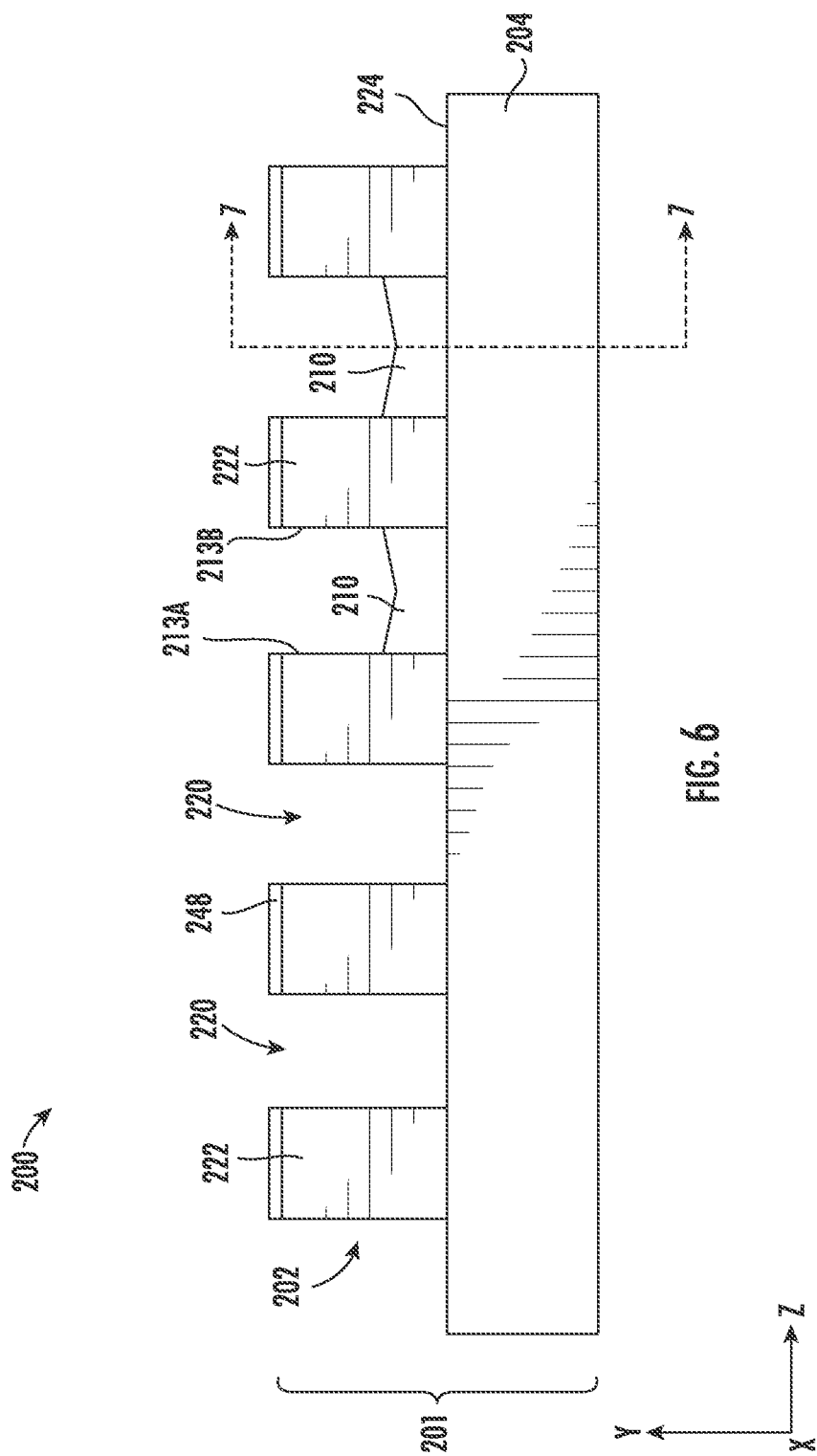
FIG. 6 is a side view of a semiconductor device in accordance with embodiments of the present disclosure.

Referring now to FIG. 6, a device 200 according to embodiments of the present disclosure will be described in greater detail. The device 200 may be similar in many respects to the device 100 in FIGS. 1-5. As such, only certain aspects of the device 200 will hereinafter be described for the sake of brevity. FIG. 6 demonstrates the device 200 following a first etch process, such as a vertical RIE, wherein a set of trenches 220 are formed in a stack of layers 202 by etching the first layer 202. Once patterned, the first layer 202 may include a plurality of mask lines 222. Notably, should a layer of photoresist material 248 contain a line defect, that line defect is not present in the plurality of mask lines 222. In some cases, it's possible for bridge defects 210 to be transferred to the first layer 202. As shown, the bridge defects 210 may be formed between a first mask line sidewall 213A and a second mask line sidewall 213B.

Figure 7:
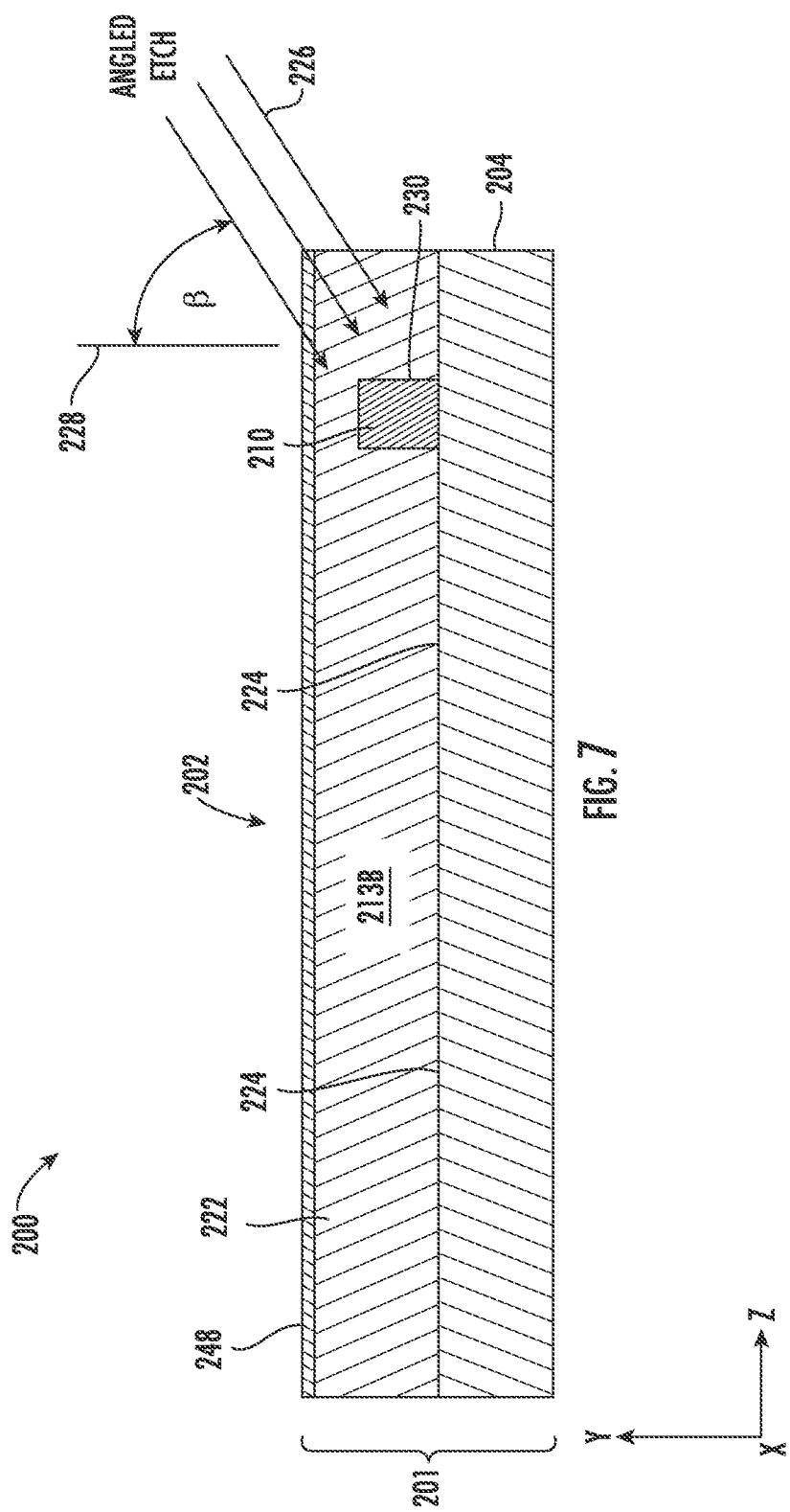
FIG. 7 is a cross-sectional view along cut line 7-7 of FIG. 6 in accordance with embodiments of the present disclosure.

In FIG. 7, the bridge defects 210 are removed by performing a second etch process 226 delivered at a non-zero angle of inclination (($3$) with respect to a perpendicular 228 to a plane defined by an upper surface of 224 of the second layer 204. Although non-limiting, the non-zero angle of inclination may be approximately 60°. To remove the bridge defects 210, the ions of the second etch process 226 are configured to impact a sidewall 230 thereof. As shown, the second etch process 226 may be delivered substantially parallel to a plane defined by the sidewall surface 213B of the plurality of mask lines 222. In various embodiments, the second etch process 226 is an anisotropic reactive ion etch or an isotropic reactive ion etch. Following the second etch process 226, the bridge defects 210 may be removed selective to the upper surface of 224 of the second layer 204.

In the embodiment shown in FIGS. 6-7, the layer of photoresist material 248 may remain atop the mask lines 222 following the first etch process to protect the mask lines 222 during the second etch process 226. In some embodiments, the second etch process 226 recesses or substantially removes the layer of photoresist material 248.

Figure 8:
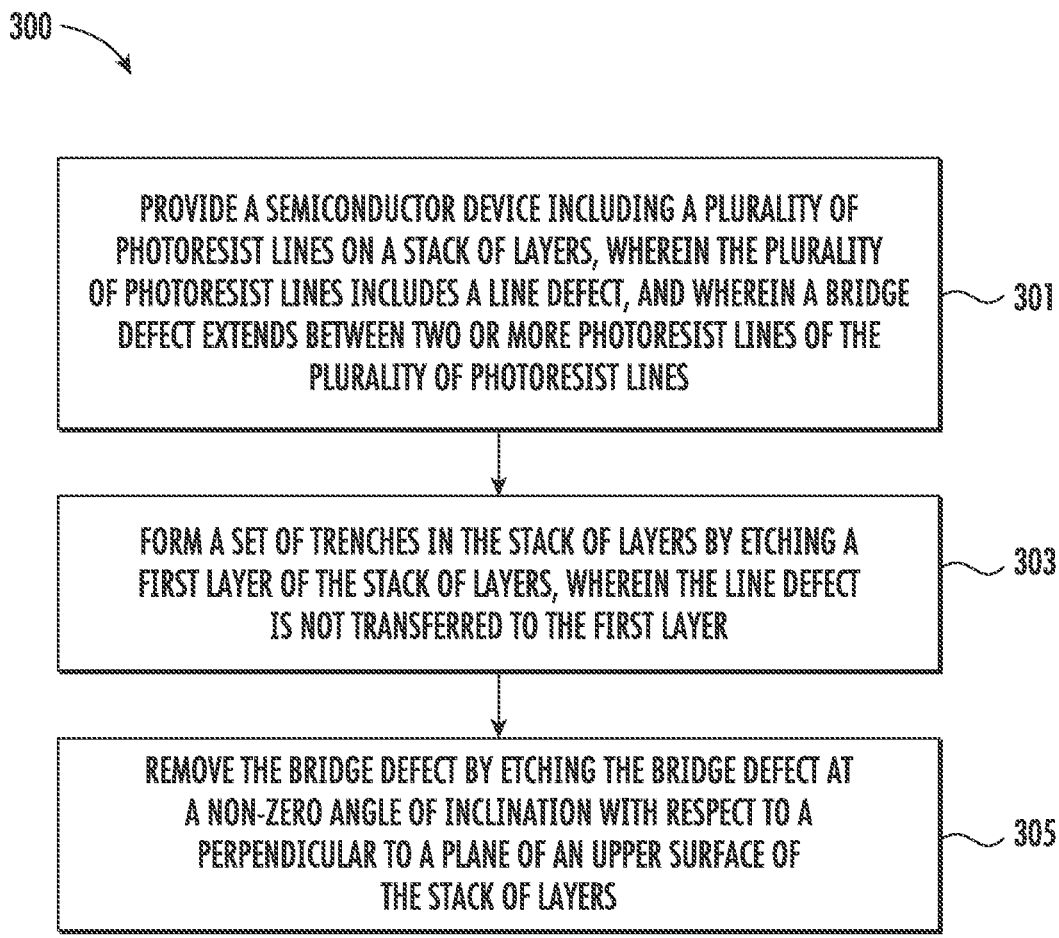
FIG. 8 is a flowchart illustrating an exemplary method according to the present disclosure.

Referring now to FIG. 8, a flow diagram illustrating an exemplary method 300 for eliminating or greatly reducing defects from a semiconductor device in accordance with the present disclosure is shown. The method 300 will be understood in conjunction with the representations shown in FIGS. 1-5.

At block 301, the method 300 may include providing a semiconductor device including a plurality of photoresist features on a stack of layers, wherein the plurality of photoresist features includes a bridge defect extending between two or more photoresist lines of the plurality of photoresist lines. In some embodiments, at least one photoresist line of the plurality of photoresist lines includes a line defect. In some embodiments, the stack of layers includes a masking layer atop a substrate. In some embodiments, the bridge defect extends just partially up a sidewall of the plurality of photoresist lines. In some embodiments, the bridge defect extends along an upper surface of the stack of layers. In some embodiments, each of the plurality of photoresist lines has a uniform height except in those areas including a line defect. Each of the plurality of photoresist lines may also have a uniform width except in those areas including a bridge defect.

At block 303, the method 300 may include forming a plurality of mask lines by etching a set of trenches in a first layer of the stack of layers. In some embodiments, the line defect is not transferred to the first layer. In some embodiments, the first layer is etched using a vertical RIE.

At block 305, the method 300 may further include removing the bridge defect by etching the bridge defect at a non-zero angle of inclination with respect to a perpendicular to a plane of an upper surface of the stack of layers. In some embodiments, the method may include etching the bridge defect between the plurality of mask lines. In some embodiments, the etch may be an anisotropic or isotropic reactive ion etch reactive ion etch. In some embodiments, the non-zero angle of inclination is approximately 60°.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. One of skill in the art will understand various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions, including conjunctive and disjunctive, in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure. The directional references do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the illustrative method 300 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be necessary to implement a methodology in accordance with the present disclosure. Furthermore, the method 300 may be implemented in association with the formation and/or processing of structures illustrated and described herein as well as in association with other structures not illustrated.

The term "substrate" used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

In view of the foregoing, at least the following advantages are achieved by the embodiments disclosed herein. Firstly, by addressing line and bridge defects separately, the first etch process described herein may optimize a transfer pattern without broken line defects, as any bridge defects are not specifically targeted during the first etch. Secondly, by performing a second, directional etch process to remove bridge defects, line/space critical dimension (CD) and line edge roughness (LER)/line width roughness (LWR) requirements may be maintained.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
forming a plurality of device features by etching a set of trenches into a stack of layers; and
removing a bridge defect between two or more device features of the plurality of device features by etching the bridge defect at a non-zero angle of inclination with respect to a perpendicular to a plane of an upper surface of the stack of layers.

2. The method of claim 1, further comprising etching a sidewall and a top surface of the bridge defect to remove the bridge defect.

3. The method of claim 2, further comprising removing the bridge defect selective to an upper surface of a substrate of the stack of layers.

4. The method of claim 1, wherein the plurality of device features is a plurality of photoresist lines in a patterned photoresist.

5. The method of claim 4, further comprising providing a line defect in the patterned photoresist, wherein the line defect is not present in the masking layer following formation of the set of trenches.

6. The method of claim 1, further comprising etching a masking layer of the stack of layers to form the plurality of device features.

7. The method of claim 6, wherein etching the masking layer of the stack of layers comprises performing a vertical etch.

8. The method of claim 6, wherein the bridge defect extends between a first mask line sidewall and a second mask line sidewall, and wherein the masking layer of the stack of layers is etched in a direction parallel to the first mask line sidewall and the second mask line sidewall.

9. The method of claim 1, wherein etching the bridge defect comprises performing one of: an anisotropic reactive ion etch, and an isotropic reactive ion etch.

10. A method for minimizing device defects, comprising:
providing a stack of layers including a line defect and a bridge defect;
forming a plurality of masking lines in a masking layer of the stack of layers, wherein the line defect is not present in the plurality of masking lines; and
removing the bridge defect by etching the bridge defect at a non-zero angle of inclination with respect to a perpendicular to a plane of the stack of layers.

11. The method of claim 10, further comprising etching a sidewall and a top surface of the bridge defect to remove the bridge defect.

12. The method of claim 11, further comprising removing the bridge defect selective to an upper surface of a substrate of the stack of layers.

13. The method of claim 10, further comprising etching the masking layer using one of: an anisotropic reactive ion etch, and an isotropic reactive ion etch.

14. The method of claim 10, wherein the bridge defect extends between a first mask line sidewall and a second mask line sidewall, and wherein etching the bridge defect comprises etching the masking layer in a direction parallel to the first mask line sidewall and the second mask line sidewall.

15. The method of claim 10, wherein forming the plurality of masking lines comprises performing a vertical etch oriented substantially parallel to the perpendicular to the plane of the stack of layers.

16. A method for reducing transfer pattern defects, the method comprising:
providing a plurality of photoresist lines having a line defect, wherein a bridge defect extends between two or more photoresist lines of the plurality of photoresist lines; and
forming a set of trenches in a masking layer, wherein the line defect is not transferred to the masking layer during formation of the set of trenches.

17. The method of claim 16, further comprising removing the bridge defect by etching the bridge defect at a non-zero angle of inclination with respect to a perpendicular to a plane of an upper surface of a stack of layers.

18. The method of claim 17, further comprising performing a reactive ion etch to a sidewall and to a top surface of the bridge defect to remove the bridge defect, wherein the bridge defect is removed selective to an upper surface of a substrate of the stack of layers.

19. The method of claim 17, further comprising forming a plurality of masking lines from the masking layer, wherein removing the bridge defect further comprises etching the masking layer in a direction substantially parallel to a sidewall of the plurality of masking lines.

20. The method of claim 17, wherein etching the masking layer and etching the bridge defect comprises performing one of: an anisotropic reactive ion etch, and an isotropic reactive ion etch.

* * * * *